United States Patent
Kasahara et al.

(10) Patent No.: US 8,084,360 B2
(45) Date of Patent: Dec. 27, 2011

(54) METHOD OF MANUFACTURING SEMICONDUCTOR DEVICE

(75) Inventors: Yusuke Kasahara, Yokohama (JP); Hisataka Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/964,007

(22) Filed: Dec. 9, 2010

(65) Prior Publication Data
US 2011/0269290 A1 Nov. 3, 2011

(30) Foreign Application Priority Data
Apr. 28, 2010 (JP) .................. 2010-103602

(51) Int. Cl.
*H01L 21/308* (2006.01)

(52) U.S. Cl. ............. 438/669; 438/689; 257/E21.235; 257/E21.214

(58) Field of Classification Search .......... 438/382, 438/453, 652, 669, 689; 257/E21.235, E21.214; 216/37, 39, 41, 54
See application file for complete search history.

(56) References Cited

U.S. PATENT DOCUMENTS

| 2005/0069732 A1* | 3/2005 | Kamata et al. .......... 428/694 TC |
| 2008/0200026 A1* | 8/2008 | Koh et al. ............... 438/643 |
| 2010/0130011 A1* | 5/2010 | Endoh et al. ............. 438/689 |

FOREIGN PATENT DOCUMENTS

| JP | 2004203675 A * | 7/2004 |
| JP | 2006-303500 | 11/2006 |
| JP | 2009-111324 | 5/2009 |

* cited by examiner

*Primary Examiner* — Khiem D Nguyen
*Assistant Examiner* — Christine Enad
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming a first film containing boron (B) on a member to be etched, the member being a semiconductor substrate, or a film formed on the semiconductor substrate, and forming a second film formed of a silicon oxide film on the first film. The method further includes pressing an original plate having a pattern formed in an uneven shape onto the second film to transfer the pattern to the second film, and etching the first film by using the second film where the pattern is transferred as a mask, with an etching gas that contains fluoromethane ($CH_3F$) and oxygen ($O_2$) and has an oxygen concentration of 50 to 90 at. %, to transfer the pattern to the first film. The method further includes etching the member by using the first film where the pattern is transferred as a mask, to form a concave portion having the pattern in the member.

20 Claims, 7 Drawing Sheets

METHOD OF MANUFACTURING SEMICONDUCTOR DEVICE

CROSS REFERENCE TO RELATED APPLICATION

This application is based upon and claims the benefit of priority from the prior Japanese Patent Application No. 2010-103602, filed on Apr. 28, 2010, the entire contents of which are incorporated herein by reference.

FIELD

Embodiments described herein relate to a method of manufacturing a semiconductor device.

BACKGROUND

In recent years, to achieve a high integration and a high performance of a semiconductor device, an etching to form a pattern having a high aspect ratio, and an etching to form a hard mask having a large thickness are required.

For this reason, when the hard mask is to be etched with using a mask of a photoresist patterned by lithography, the selectivity between the photoresist and the hard mask may be insufficient, so that the hard mask may not be etched. On the other hand, if a photoresist to be patterned by lithography is thick, the focal depth of the lithography is not likely to fit, so that an exposure may be disabled, which makes it impossible to pattern the photoresist. In order to resolve this problem, for example, a stacked mask process (SMAP) method is used.

In the SMAP method, a pattern formed in a photoresist is transferred to an intermediate film made of silicon oxide or silicon having a thickness of about 50 nm. In this case, since the thickness of the intermediate film is as small as about 50 nm, the pattern can be transferred before the photoresist is lost. The pattern is then transferred to a carbon film which is a lower layer having a thickness of about 300 nm and formed by coating, chemical vapor deposition (CVD) or the like, by using the intermediate film as a mask. At this time, if the intermediate film and the carbon film are etched by reactive ion etching (RIE) using a gas containing $O_2$, $N_2$, and $H_2$ as main components, the selectivity can be increased. Therefore, it is possible to transfer the pattern to the carbon film having a large thickness. In this way, the pattern can be transferred to a hard mask of a lower layer of the carbon film, by using the carbon film where the pattern is transferred and having a large thickness as a mask. In addition, the carbon film can be removed through ashing, if necessary.

If the multilayered structure such as that in the SMAP method is used, it is possible to transfer the pattern to the hard mask. In such a case, however, since the number of stacked layers increases, the number of processes increases and a manufacturing cost increases.

DETAILED DESCRIPTION

Embodiments will now be explained with reference to the accompanying drawings.

An embodiment described herein is a method of manufacturing a semiconductor device, the method including forming a first film containing boron (B) on a member to be etched, the member being a semiconductor substrate, or a film formed on the semiconductor substrate, and forming a second film formed of a silicon oxide film on the first film. The method further includes pressing an original plate having a pattern formed in an uneven shape onto the second film to transfer the pattern to the second film, and etching the first film by using the second film where the pattern is transferred as a mask, with an etching gas that contains fluoromethane ($CH_3F$) and oxygen ($O_2$) and has an oxygen concentration of 50 to 90 at. %, to transfer the pattern to the first film. The method further includes etching the member by using the first film where the pattern is transferred as a mask, to form a concave portion having the pattern in the member.

FIGS. 1A to 5B are side sectional views showing an example of a method of manufacturing a semiconductor device according to an embodiment of the disclosure. This method will be described with an example in which a resistive memory including multiple layers is used as a semiconductor device.

Figure 1A:
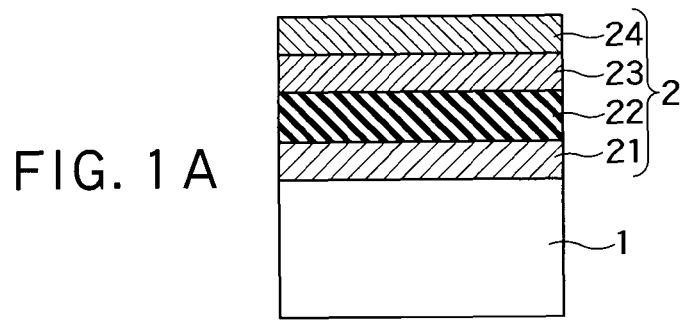
FIGS. 1A to 5B are side sectional views showing an example of a method of manufacturing a semiconductor device according to an embodiment of the disclosure.

First, as shown in FIG. 1A, a first metal film 21 formed of conductive material such as tungsten (W) or tungsten silicide (WSi), a diode film 22 formed of semiconductor such as silicon, a variable resistance film 23 formed of chalcogenide, transition metal oxide or the like, and a second metal film 24 formed of conductive material such as W or WSi are sequentially stacked on a semiconductor substrate 1 made of semiconductor such as silicon to form a first layer 2 on the semiconductor substrate 1. The first metal film 21, the diode film 22, the variable resistance film 23, and the second metal film 24 are examples of a first metal film, a first diode film, a first variable resistance film, and a second metal film of the disclosure, respectively.

Next, a hard mask film formed of $SiO_2$ or the like, an organic film formed by coating or chemical vapor deposition (CVD), an intermediate film formed of silicon oxide, silicon or the like, and a resist are sequentially stacked on the second metal film 24 of the first layer 2, to form a line and space pattern (L/S pattern) where line patterns and space patterns are periodically repeated at the pitch of 100 nm or less in the resist by lithography.

Figure 1B:
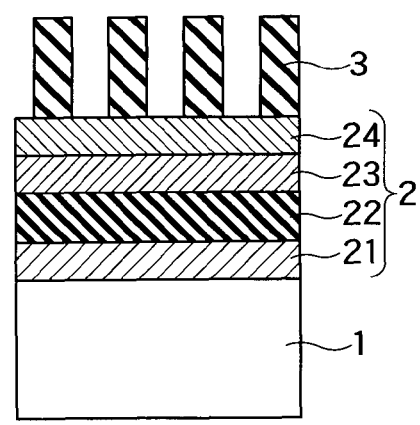

Next, the L/S pattern formed in the resist is transferred to the intermediate film, then transferred to the organic film by using the intermediate film as a mask, and then transferred to the hard mask film by using the organic film as a mask, by reactive ion etching (RIE). After the L/S pattern is formed in the hard mask film, the organic film is removed by ashing, so that a hard mask 3 shown in FIG. 1B is formed.

Figure 1C:
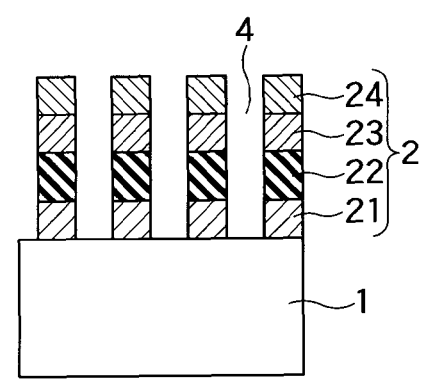

Next, as shown in FIG. 1C, the first metal film 21, the diode film 22, the variable resistance film 23, and the second metal film 24 of the first layer 2 are collectively etched by RIE using the hard mask 3 as a mask, to form plural trenches 4 in the first layer 2. By forming the trenches 4, the first metal film 21 becomes bit lines. The trenches 4 are an example of first trenches of the disclosure. The trenches 4 are formed to extend in a first direction parallel to a principal plane of the semiconductor substrate 1 (i.e., direction vertical to a plane of paper in FIG. 1C).

Figure 1D:
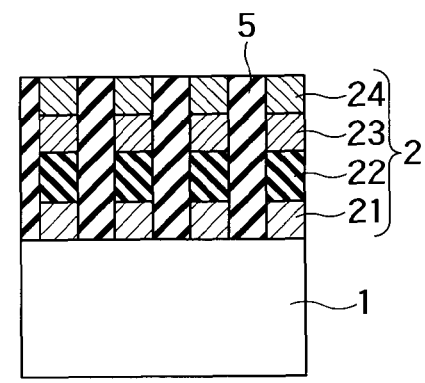

Next, after the hard mask 3 is removed by wet etching, as shown in FIG. 1D, an $SiO_2$ film that forms an inter layer dielectric 5 is buried in the trenches 4. The inter layer dielectric 5 is an example of a first inter layer dielectric of the disclosure. Next, the inter layer dielectric 5 is removed by chemical mechanical polishing (CMP) until a top surface of the inter layer dielectric 5 is aligned with a top surface of the second metal film 24, so that surfaces of the second metal film 24 and the inter layer dielectric 5 are planarized.

Figure 2A:
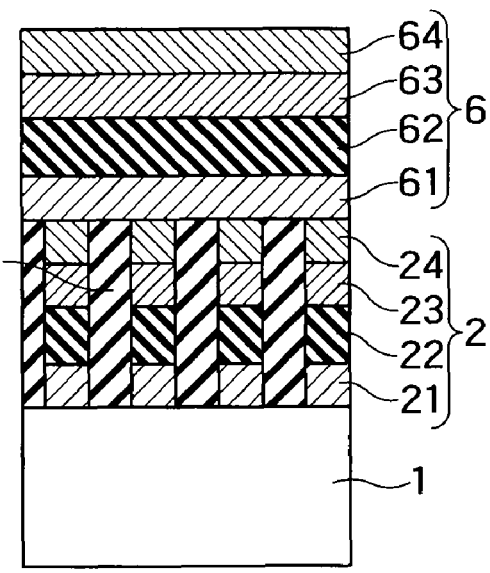

Next, as shown in FIG. 2A, similar to the first layer 2, a first metal film 61 formed of conductive material such as W or WSi, a diode film 62 formed of semiconductor such as silicon, a variable resistance film 63 formed of chalcogenide, transition metal oxide or the like, and a second metal film 64 formed of conductive material such as W or WSi are sequentially stacked on the first layer 2 to form a second layer 6 on the first layer 2. The first metal film 61, the diode film 62, the variable resistance film 63, and the second metal film 64 are examples of a third metal film, a second diode film, a second variable resistance film, and a fourth metal film of the disclosure, respectively.

Figure 2B:
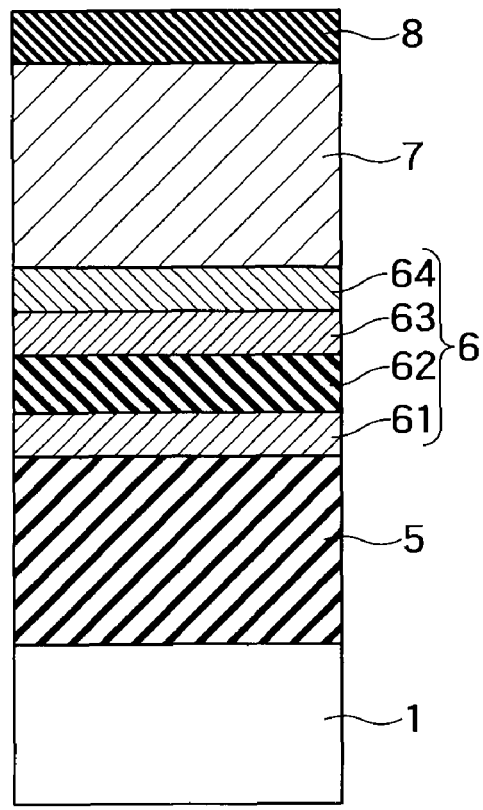

Next, as shown in FIG. 2B, a boron nitride (BN) film 7 functioning as a hard mask is formed on the second metal film 64 of the second layer 6 with the thickness of about 200 to 300 nm by CVD. The BN film 7 is an example of a first film of the disclosure.

If the concentration of boron (B) in the BN film 7 increases, the etching resistance can be improved, so that a concave portion (for example, hole or trench) having a high aspect ratio (for example, 10 to 20) can be formed in a member to be etched. Accordingly, the concentration of B may be determined according to the etching resistance, the etching selectivity, or the aspect ratio to be required. In this embodiment, the BN film 7 containing B of 50 wt % or more, preferably 80 wt % or more, and more preferably 90 wt % or more is used. If the concentration of B is set to 80 wt % or more, the resistance in a case in which the inter layer dielectrics 5 and 12 are etched becomes extraordinarily high. As a result, a required thickness of the hard mask can be decreased, so that a miniaturized pattern can be formed.

Next, as shown in FIG. 2B, a coating type silicon oxide film (also called spin-on-glass (SOG) film) 8 functioning as a light curing resin to be cured by irradiation of an ultraviolet ray is coated on the BN film 7. The silicon oxide film 8 is an example of a second film of the disclosure. The thickness of the silicon oxide film 8 is, for example, 20 to 60 nm, and the thickness of the silicon oxide film 8 is about 1/5 to 1/10 of the thickness of the BN film 7. In each of FIGS. 2B to 5B, a sectional direction is shown as a direction orthogonal to those of FIGS. 1A to 2A.

Figure 3A:
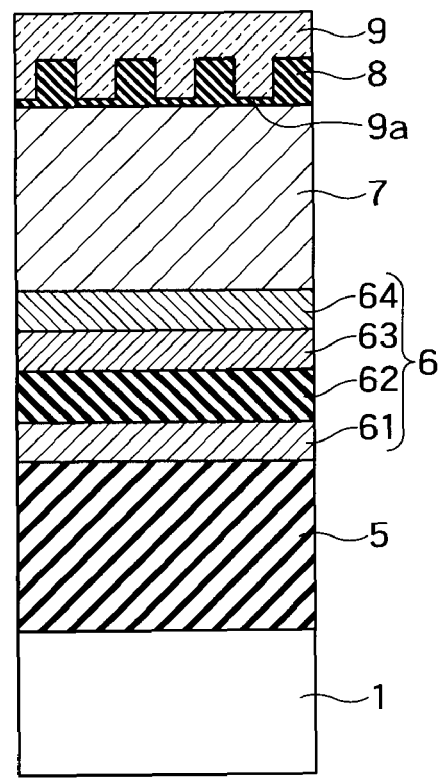

Next, as shown in FIG. 3A, a template (original plate) 9 having a pattern 9a formed in an uneven shape is pressed onto the silicon oxide film 8, and an ultraviolet ray is irradiated onto the silicon oxide film 8 from the back surface side of the template 9, so that the silicon oxide film 8 is cured.

Figure 3B:
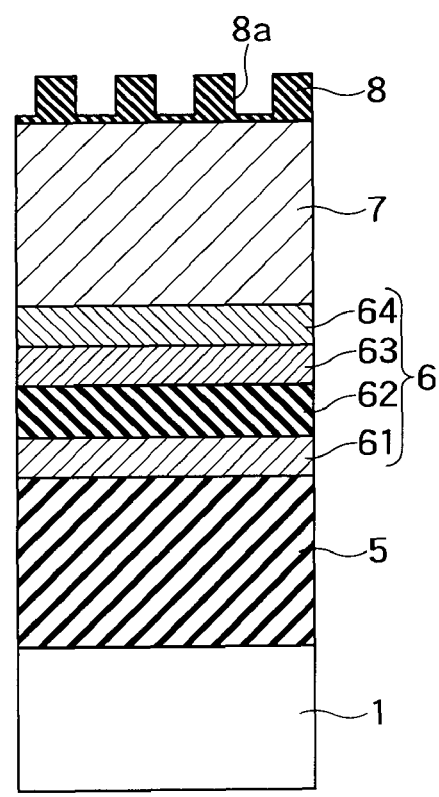

Next, as shown in FIG. 3B, the template 9 is separated, so that an L/S pattern 8a having plural concave portions and plural convex portions is formed in the silicon oxide film 8. The pitch between the concave portions or between the convex portions is set to 100 nm or less. In the nanoimprint technology, since the reflection of light from the resist does not need to be considered different from lithography, an anti-reflection film is not needed. For this reason, a mask can be formed directly on the BN film 7, so that the film structure can be simplified.

Figure 4A:
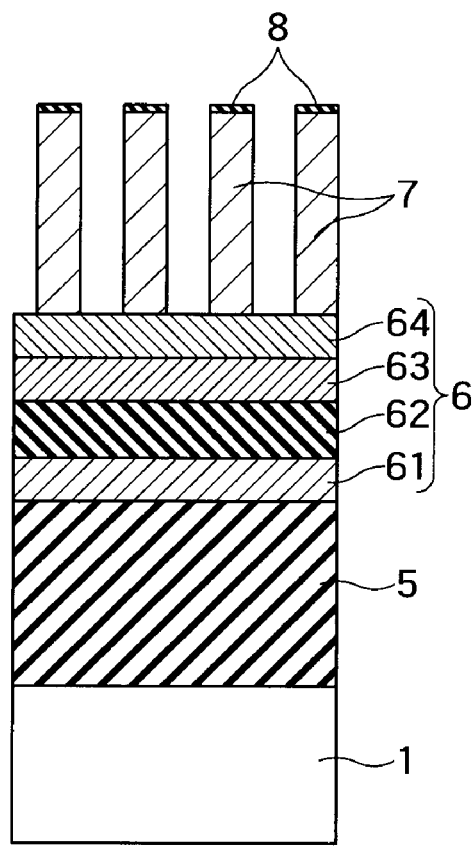

Next, as shown in FIG. 4A, the BN film 7 is etched by RIE using the silicon oxide film 8 as a mask. Since the BN film 7 is significantly thicker than the silicon oxide film 8, the etching is performed under an etching condition where an etching selectivity of the deposition film of the BN film 7 with respect to the deposition film of the silicon oxide film 8 is 10 or more, preferably 50 or more, and more preferably 100 or more.

In the etching condition to set a high selectivity, for example, a mixed gas of fluoromethane ($CH_3F$), oxygen ($O_2$), and argon (Ar) is used as an etching gas. At this time, if the oxygen concentration of the etching gas is set to 50 to 90 at. %, preferably, 75 to 85 at. %, a high etching selectivity of BN with respect to $SiO_2$ is enabled. In the etching gas, if the oxygen, $CH_3F$, and Ar concentrations of the etching gas are set to 80 at. %, 10 at. %, and 10 at. %, respectively, $SiO_2$ is rarely etched, but BN is etched, so that a superior characteristic is obtained. The oxygen concentration of the etching gas can be determined in a constant range that includes a value where an etching rate (E/R) of the silicon oxide film 8 is 0. For example, the oxygen concentration of the etching gas can be determined in a range within ±5 at. % or ±10 at. % with the value where E/R of the silicon oxide film 8 is 0 as an intermediate value.

As an RIE apparatus, a parallel flat plate RIE apparatus where two frequencies of 100 MHz and 13.56 MHz are superposed is used. As an etching power to be used, a power of 13.56 MHz is preferably set in a range of 300 to 1500 W. If the power of 13.56 MHz is set to 1500 W or more, the E/R increases because a bias increases. However, a shoulder dropping of the SOG film that is a mask may be easily generated, and it becomes difficult to perform etching in a vertical shape. In this embodiment, a power of 100 MHz is set to 500 W, a power of 13.56 MHz is set to 500 W, the pressure is set to 75 mT, and a gas flow rate is set to $CH_3F/O_2/Ar=40/280/40$ sccm.

If a carbon film is used instead of the BN film 7 and $O_2$ is used as the etching gas, an etching with a high selectivity is enabled with respect to the SOG. However, the carbon film may be easily side etched, and it is difficult to form a miniaturized pattern with superior dimension controllability. If a miniaturized L/S pattern is formed of the mask of the carbon material and an etching film to be etched is etched using a gas containing fluorine (F), the carbon mask is known to be bent due to a reaction with F radical. If an oxide film is included in the etching film to be etched, the etching needs to be performed using the gas containing F. For this reason, if the carbon film is used as the mask, bending of the mask causes a problem. Since this problem occurs, the BN film rather than the carbon film is preferably used in view of the etching for miniaturization.

Figure 4B:
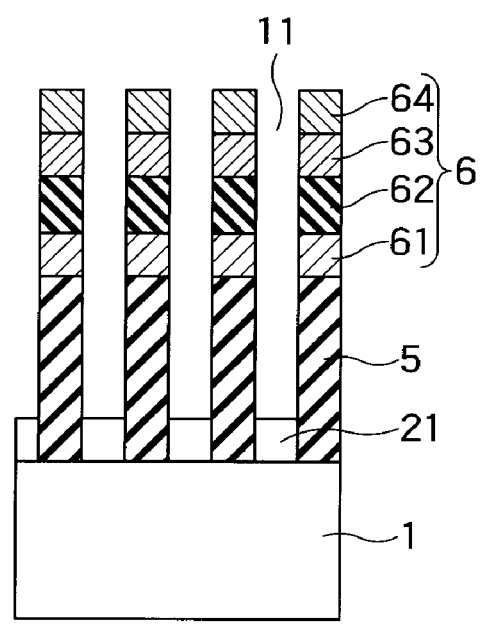

As shown in FIG. 4B, the films 61, 62, 63, and 64 of the second layer 6, the films 22, 23, and 24 of the first layer 2 except for the first metal film 21, and the inter layer dielectric 5 of the first layer 2 are collectively etched by using the BN film 7 etched in the above-described way as a mask, so that plural trenches 11 are formed in the first film 2, second film 6, and inter layer dielectric 5. By forming the trenches 11, the first metal film 61 becomes word lines corresponding to the above-described bit lines. Also, the first layer 2 becomes elements having pillar shapes. Also, the second layer 6 becomes an L/S pattern. If the same process is executed on the second layer 6 and a third layer to be formed on the second layer 6, elements having the same pillar shapes as the elements of the first layer 2 are formed in the second layer 6. The trenches 11 are an example of second trenches of the disclosure. The trenches 11 are formed to extend in a second direction parallel to the principal plane of the semiconductor substrate 1 and vertical to the first direction (i.e., direction vertical to a plane of paper in FIG. 4B).

As shown in FIG. 4B, when the trenches 11 are formed, the films of the first layer 2 except for the first metal film 21, namely, films 22, 23, and 24, are etched. Consequently, a top surface of the first metal film 21 is exposed in the trenches 11. The first metal film 21 is used as the bit lines for the first layer 2, and the first metal film 61 is used as the word lines for the first layer 2. Further, the first metal 61 is also used as bit lines for the second layer 6.

Figure 7:
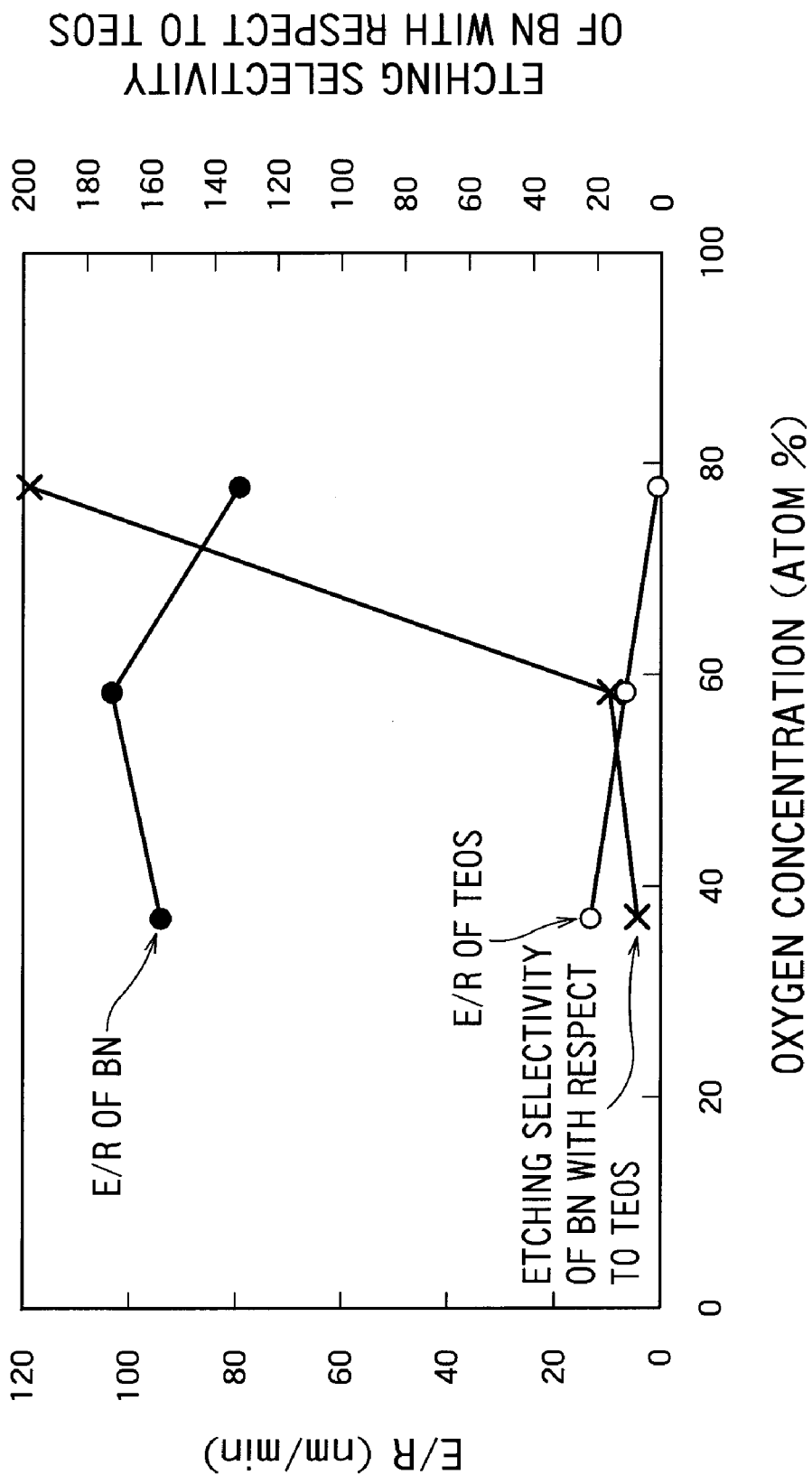
FIG. 7 is a graph showing an oxygen concentration dependency of an etching selectivity of a BN (boron nitride) deposition film with respect to a TEOS (tetra ethyl ortho silicate) deposition film.

FIG. 7 is a graph showing an oxygen concentration dependency of an etching selectivity of a BN deposition film with respect to a TEOS (tetra ethyl ortho silicate) deposition film. In FIG. 7, E/R indicates an etching rate. The etching selectivity of the BN with respect to the TEOS is represented by (E/R of BN)/(E/R of TEOS). The oxygen concentration dependency of the etching selectivity is measured using the TEOS film having the same E/R as the silicon oxide film 8 and the BN film containing B of 90 wt %. As a RIE apparatus, a parallel flat plate RIE apparatus where two frequencies of 100 MHz and 13.56 MHz are superposed is used. In this case, a power of 100 MHz is set to 500 W, a power of 13.56 MHz is set to 500 W, and the pressure is set to 75 mT.

As can be seen from FIG. 7, if the oxygen concentration is set to 50 at. % or more, the etching selectivity of the BN with respect to the TEOS can be set to 10 or more. When the oxygen concentration is 80 at. %, the TEOS film is rarely etched and the BN film is etched. However, since the etching rate of the BN film is lowered, the oxygen concentration is preferably 90 at. % or less.

Figure 5A:
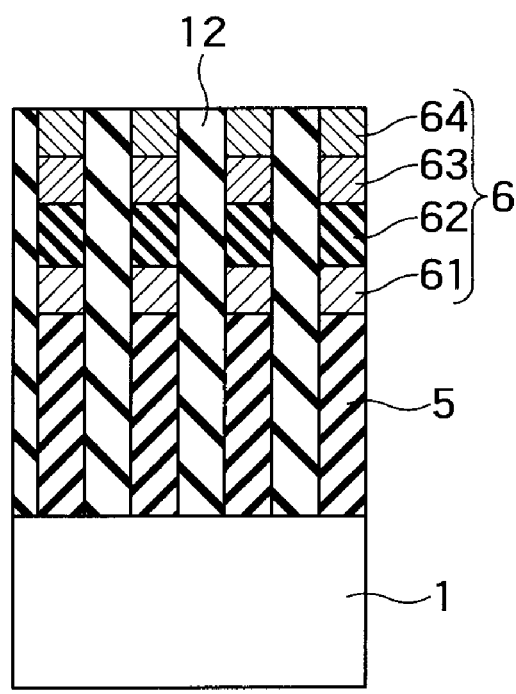
Figure 5B:
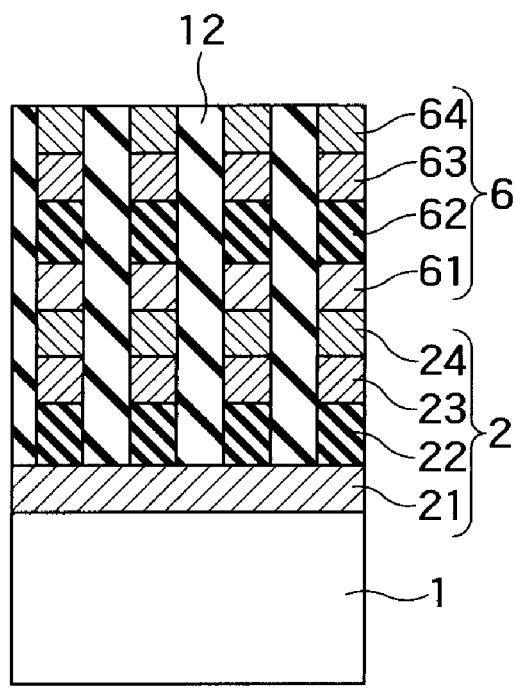
Figure 6:
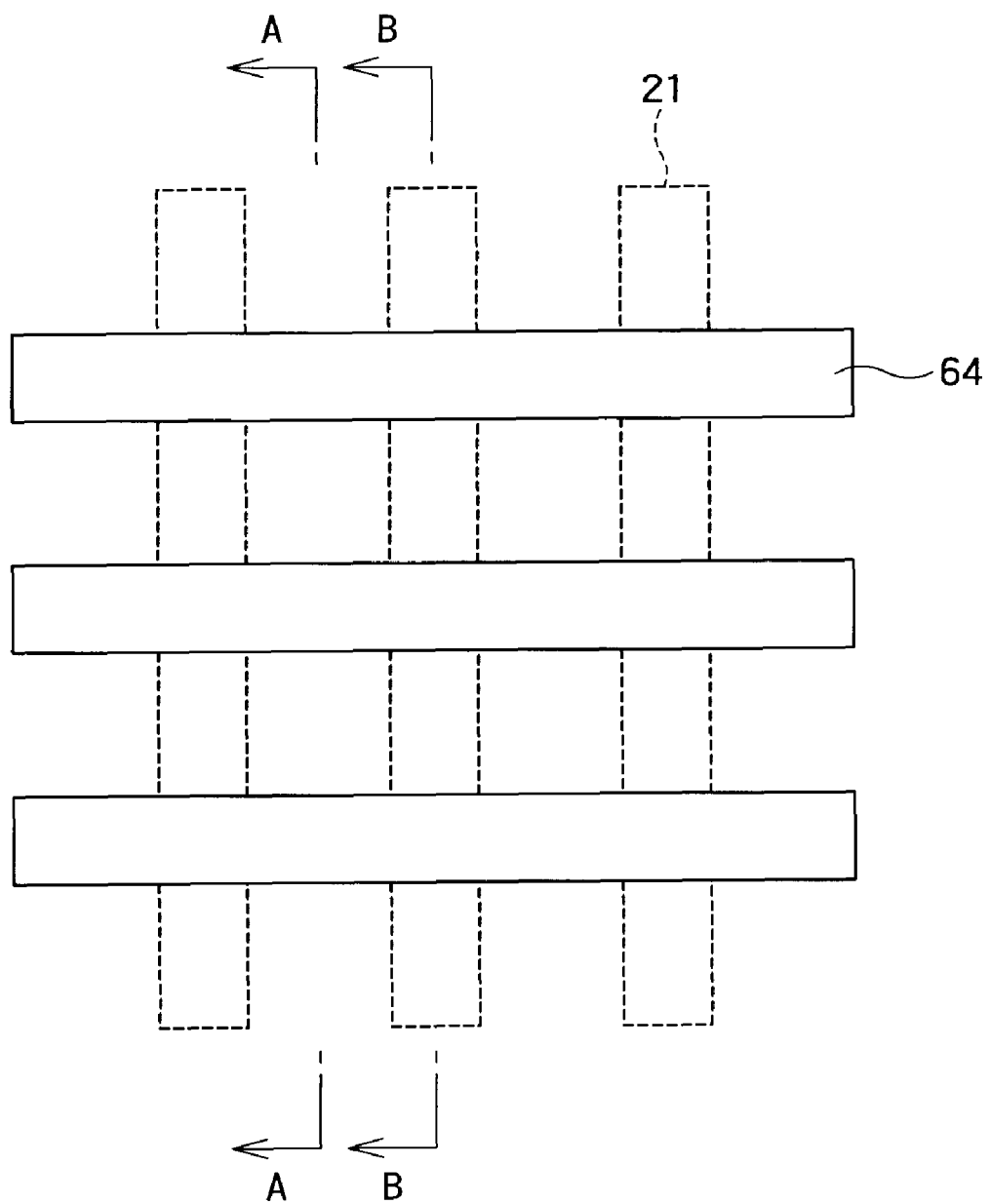
FIG. 6 is a plan view showing interconnects of a resistive memory.

After the trenches 11 are etched, the BN film 7 is removed by alkaline wet etching or dry etching under a high selectivity condition where the oxygen concentration is about 80 at. % using $CH_3F$ used at the time of etching the hard mask. As shown in FIGS. 5A and 5B, an $SiO_2$ film that forms an inter layer dielectric 12 is buried in the trenches 11. The inter layer dielectric 12 is an example of a second inter layer dielectric of the disclosure. FIG. 5A is a side sectional view taken along the line A-A of FIG. 6, and FIG. 5B is a side sectional view taken along the line B-B of FIG. 6. FIG. 6 is a plan view showing interconnects of a resistive memory. The inter layer dielectric 12 is buried in the trenches 11 to cover the top surface of the first metal film 21 exposed in the trenches 11.

By repeating the above process, a miniaturized multilayered resistive memory having three layers or more can be formed with a low-cost process.

Effect of the Embodiment

According to the embodiment described above, the pattern is formed in the silicon oxide film 8 of the first film using the nanoimprint technology, and the hard mask of the second film is etched with the high selectivity using the silicon oxide film 8 where the pattern is formed as the mask. Therefore, the etching of the concave portions having the high aspect ratio can be performed on the member to be etched with the film structure having a smaller number of the stacked films than that in the SMAP method.

The disclosure is not limited to the embodiment, and various modifications can be made within a range that does not depart from the spirit and scope of the disclosure.

For example, in the embodiment, the film that is formed on the semiconductor substrate is described as the member to be etched. However, only the semiconductor substrate may be etched and the semiconductor substrate and the film may be collectively etched.

The case where the stacked structure of the silicon oxide film, the silicon film, and the conductive material film is collectively etched by RIE is described. However, a stacked structure of the silicon oxide film and the silicon film or a stacked structure of the silicon oxide film and the conductive material film may be collectively etched by RIE. Alternatively, a single layer such as the silicon oxide film, the silicon film, or the conductive material film may be etched.

The BN is described as the second film, but another material containing boron (B) such as SiBN may be used.

As described above, according to the embodiments described herein, a method of manufacturing a semiconductor device that can perform an etching of the high aspect ratio on the member to be etched with the film structure having a smaller number of the stacked films than that in the SMAP method can be provided.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:
   forming a first film containing boron (B) on a member to be etched, the member being a semiconductor substrate, or a film formed on the semiconductor substrate;
   forming a second film formed of a silicon oxide film on the first film;
   pressing an original plate having a pattern formed in an uneven shape onto the second film to transfer the pattern to the second film;
   etching the first film by using the second film where the pattern is transferred as a mask, with an etching gas that contains fluoromethane ($CH_3F$) and oxygen ($O_2$) and has an oxygen concentration of 50 to 90 atom %, to transfer the pattern to the first film; and
   etching the member by using the first film where the pattern is transferred as a mask, to form a concave portion having the pattern in the member.

2. The method according to claim 1, wherein the first film contains boron (B) of 80 wt % or more.

3. The method according to claim 1, wherein a thickness of the first film is 200 to 300 nm.

4. The method according to claim 1, wherein the first film is a boron nitride (BN) film.

5. The method according to claim 1, wherein a thickness of the second film is 20 to 60 nm.

6. The method according to claim 1, wherein a thickness of the second film is 1/5 to 1/10 of a thickness of the first film.

7. The method according to claim 1, wherein the second film is formed of a coating type silicon oxide film serving as a light curing resin.

8. The method according to claim 1, wherein
   the pattern transferred to the second film is a line and space pattern having plural concave portions and plural convex portions, a pitch between the concave portions or between the convex portions being equal to or smaller than 100 nm.

9. The method according to claim 1, wherein
   the pattern is transferred to the first film under an etching condition where an etching selectivity of the first film with respect to the second film is equal to or greater than 100.

10. The method according to claim 1, wherein
    the pattern is transferred to the first film with using the etching gas having the oxygen concentration of 75 to 85 at. %.

11. The method according to claim 1, wherein
the member is etched by collectively etching a stacked structure of a silicon oxide film and a silicon film, a stacked structure of a silicon oxide film and a conductive material film, or a stacked structure of a silicon oxide film, a silicon film, and a conductive material film.

12. The method according to claim 1, wherein
the member is etched so that the concave portion has an aspect ratio of 10 or more.

13. The method according to claim 1, wherein the member comprises:
a first layer formed on the semiconductor substrate, and including a film for forming bit lines; and
a second layer formed on the first layer, and including a film for forming word lines corresponding to the bit lines.

14. The method according to claim 13, wherein
the bit lines are formed by forming first trenches in the first layer, the first trenches extending in a first direction parallel to a principal plane of the semiconductor substrate, and
the word lines are formed by forming second trenches in the first and second layers, the second trenches extending in a second direction parallel to the principal plane and perpendicular to the first direction.

15. The method according to claim 14, wherein
the first trenches are formed in the first layer and are filled with a first inter layer dielectric, before the second layer is formed on the first layer.

16. The method according to claim 14, wherein
the second trenches are formed to expose upper surfaces of the bit lines in the second trenches, and are filled with a second inter layer dielectric to cover the upper surfaces of the bit lines.

17. The method according to claim 14, wherein
the concave portion formed in the member is one of the second trenches.

18. The method according to claim 16, wherein
the second trenches are filled with the second inter layer dielectric after the first film on the member is removed.

19. The method according to claim 13, wherein
the first layer comprises a first metal film, a first diode film, a first variable resistance film, and a second metal film successively formed on the semiconductor substrate, and
the bit lines are formed by using the first metal film.

20. The method according to claim 19, wherein
the second layer comprises a third metal film, a second diode film, a second variable resistance film, and a fourth metal film successively formed on the first layer, and
the word lines are formed by using the third metal film.

* * * * *